United States Patent
Lu et al.

(10) Patent No.: US 7,491,624 B2
(45) Date of Patent: Feb. 17, 2009

(54) METHOD OF MANUFACTURING LOW CTE SUBSTRATES FOR USE WITH LOW-K FLIP-CHIP PACKAGE DEVICES

(75) Inventors: Szu-Wei Lu, Hsinchu (TW); Hsin-Hui Lee, Kaohsiung (TW); Chien-Hsiun Lee, Hsin-Chu (TW); Mirng-Ji Lii, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 236 days.

(21) Appl. No.: 11/610,752

(22) Filed: Dec. 14, 2006

(65) Prior Publication Data

US 2007/0087479 A1     Apr. 19, 2007

Related U.S. Application Data

(63) Continuation of application No. 11/160,753, filed on Jul. 7, 2005, now Pat. No. 7,170,159.

(51) Int. Cl.
H01L 21/00 (2006.01)
H01L 21/30 (2006.01)
H01L 21/44 (2006.01)

(52) U.S. Cl. .................. 438/455; 438/108; 438/612; 438/613; 257/E21.611; 257/E21.503

(58) Field of Classification Search .............. 438/106, 438/118, 455, 612, 613, 614, 615, 616, 617; 257/E21.503, E21.511

See application file for complete search history.

(56) References Cited

U.S. PATENT DOCUMENTS

| 6,552,267 | B2 * | 4/2003 | Tsao et al. ........... 174/535 |
| 2001/0020736 | A1 * | 9/2001 | Nakazawa et al. ...... 257/678 |
| 2005/0224973 | A1 * | 10/2005 | Bernier et al. ........ 257/737 |

FOREIGN PATENT DOCUMENTS

| JP | 2003213019 A | * 7/2003 |
| JP | 2004277671 A | * 10/2004 |
| JP | 2004359852 A | * 12/2004 |

* cited by examiner

*Primary Examiner*—Alexander G Ghyka
*Assistant Examiner*—Seahvosh J Nikmanesh
(74) *Attorney, Agent, or Firm*—Baker & McKenzie LLP

(57) ABSTRACT

Disclosed are techniques that teach the replacement of the typical organic, plastic, or ceramic package substrate used in semiconductor package devices with a low-CTE package substrate. In one embodiment, a semiconductor device implementing the disclosed techniques is provided, where the device comprises an integrated circuit chip having at least one coupling component formed on an exterior surface thereof. Also, the device includes a package substrate having a mounting surface with bonding pads that are configured to receive the at least one coupling component. In such embodiments, the package substrate is selected or manufactured such that it has a coefficient of thermal expansion in a direction perpendicular to its mounting surface that is less than approximately twice a coefficient of thermal expansion along a plane parallel to its mounting surface.

15 Claims, 1 Drawing Sheet

METHOD OF MANUFACTURING LOW CTE SUBSTRATES FOR USE WITH LOW-K FLIP-CHIP PACKAGE DEVICES

RELATED APPLICATION

This application is a Continuation Application of, and claims priority to, U.S. patent. application Ser. No. 11/160,753, filed Jul. 7, 2005, now U.S. Pat. No. 7,170,159, which is incorporated by reference in its entirety for all purposes.

TECHNICAL FIELD

This disclosure relates generally to manufacturing techniques for semiconductor devices, and more particularly to low CTE substrates for use with low-k flip-chip semiconductor package devices.

BACKGROUND

The packaging of integrated circuit (IC) chips is one of the most important steps in the manufacturing process, contributing significantly to their overall cost, performance and reliability. As semiconductor devices reach higher levels of integration, packaging technologies have become critical. Packaging of the IC chip accounts for a considerable portion of the cost of producing the device, and failure of the package leads to costly yield reduction.

Continued decrease in semiconductor device feature size has led to a significant increase in semiconductor device density, which places increased emphasis on device or package I/O capabilities. The metal connections, which connect the integrated circuit to other circuits or to system components, have therefore become more important and can, with further miniaturization of the semiconductor device, have an increasingly negative impact on circuit performance. One of the approaches taken to solve such packaging problems is to design chips and chip packaging techniques that offer dependable methods of increased interconnecting of chips at a reasonable manufacturing cost. This has led to the development of "flip-chip" semiconductor packages.

A flip-chip package device includes a direct electrical connection of face down (that is, "flipped") electronic components onto substrates, such as ceramic substrates, circuit boards, or carriers using conductive solder bump formed in a ball grid array (BGA) on bondpads of the chip. Flip-chip technology is quickly replacing older wire bonding technology that uses face up chips with a wire connected to each pad on the chip. Flip-chip technology fabricates bumps (typically Pb/Sn solders) on aluminum bondpads on the chips, and interconnects the bumps directly to the package media, which are usually ceramic- or plastic-based. The flip-chip is bonded face down to the package medium through the shortest paths. These technologies can be applied not only to single-chip packaging, but also to higher or integrated levels of packaging in which the packages are larger, and to more sophisticated substrates that accommodate several chips to form larger functional units. The flip-chip technique, using an array of I/O interconnects, has the advantage of achieving the highest density of interconnection to the device, combined with a very low inductance interconnection to the package.

The bumps of the flip-chip assembly serve several functions. The bumps provide an electrical conductive path from the IC chip (or die) to the substrate on which the chip is mounted. A thermally conductive path is also provided by the bumps to carry heat from the chip to the substrate. The bumps also provide part of the mechanical mounting of the chip to the substrate. A spacer is also provided by the bumps, which prevents electrical contact between the chip and the substrate connectors. Furthermore, the bumps also act as a short lead to relieve mechanical strain between the chip and the substrate.

Despite providing numerous advantages, such semiconductor package devices or assemblies are very delicate structures, the design and manufacturing of which creates difficult and unique technical problems. Continual efforts by those working in the art are being undertaken to improve the performance, reliability and useful life of microelectronic assemblies, particularly those using flip-chips. For example, the flip-chip package device can generate a considerable amount of heat during operation that may range from about 25 to 100 watts concentrated in the area of the chip, which usually ranges from 1 to 4 cubic centimeters. Those working in the art are constantly seeking ways to control and manage this concentrated heat generation to avoid failure of the package device due to overheating.

Failure to manage the heat generated by the flip-chip may be very costly. The heat generated from the flip-chip during operation may cause the chip dimensions to change and may result in damage to signals generated by the chip. Furthermore, thermal expansion may cause the chip to curve, bend or crack. These distortions in the chip may result in damage to the electrical connections between the chip and the substrate. Furthermore, the substrate onto which the flip-chip may be mounted can be a single layer structure, or the substrate may comprise two or many more layers of materials. Often these materials tend to be quite diverse in their composition and structure. The coefficient of thermal expansion (CTE) for these different layers may be considerably different and may result in uncontrolled bending or thermally induced substrate surface distortions. Such distortions can cause failure of the flip-chip or other components of the substrate. In particular, in low-k package devices, the delamination at the interface of the copper (or comparable metal) layers and the passivation layer caused by larger CTE mismatches has become a prominent source of device failure.

SUMMARY

Disclosed are techniques that replace the typical organic, plastic, or ceramic package substrate used in semiconductor package devices with a low-CTE package substrate. The use of a low CTE material as a package substrate (as compared to, for example, typical printed circuit board implementations) minimizes the CTE mismatch between the package substrate and the CTE of a typical silicon IC chip. By easing the CTE mismatch between these components of the package device, stress around the bonds between the BGA and the bonding pads of the chip or package substrate is relieved by increasing the coplanarity of the package substrate and the chip at large temperature variations. Moreover, the disclosed approach is especially beneficial in package devices employing eutectic or lead-free bumps solder bumps/balls, which tend to be more brittle due to less lead content. Still further, the CTE of the selected underfill is less critical due to the decrease in CTE mismatch between the IC chip and the package substrate, which therefore allows the manufacturer of the package device a broader choice of available underfill materials.

In one embodiment, a semiconductor device implementing the disclosed techniques is provided. In such an embodiment, the device comprises an IC chip having at least one coupling component formed on an exterior surface of the IC chip. Also, the device includes a package substrate having a mounting surface with bonding pads that are configured to receive the at least one coupling component. In such embodiments, the package substrate is selected or manufactured such that it has a coefficient of thermal expansion in a direction perpendicular to its mounting surface that is less than approximately twice a coefficient of thermal expansion along a plane parallel to its mounting surface.

In another aspect, a method of manufacturing a semiconductor device is also provided. In one embodiment, the method comprises providing an IC chip, and forming at least one coupling component on an exterior surface of the IC chip. In such embodiments, the method also includes producing a package substrate having a coefficient of thermal expansion in a direction perpendicular to its mounting surface that is less than approximately twice a coefficient of thermal expansion along a plane parallel to its mounting surface. The method also includes forming bonding pads on a mounting surface of the package substrate that are configured to receive the at least one coupling component.

BRIEF DESCRIPTION OF THE DRAWINGS

FIG. 1A illustrates a three-dimensional diagram demonstrating directions that are parallel and perpendicular to the mounting surfaces of the IC chip and package substrate illustrated in FIG. 1.

DETAILED DESCRIPTION

Figure 1:
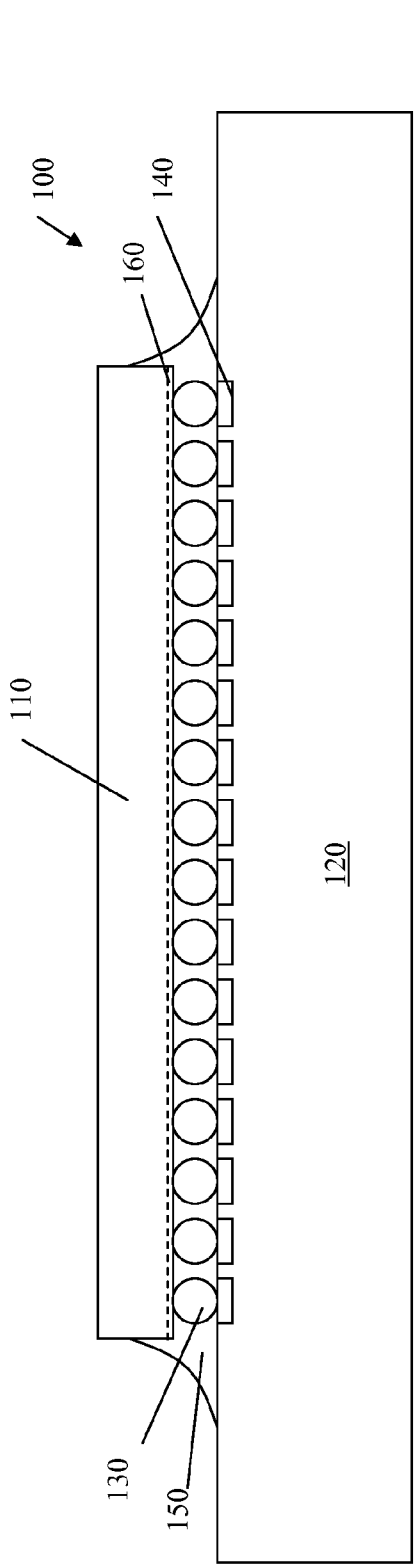
FIG. 1 illustrates one embodiment of a semiconductor package device constructed according to the disclosed principles.

Turning initially to FIG. 1, illustrated is one embodiment of a semiconductor package device 100 constructed according to the disclosed principles. Specifically, the package device 100 includes an integrated circuit (IC) chip 110 that contains numerous active and inactive components to form one or more functional integrated circuits. In addition, the IC chip 110 is configured for mounting onto another substrate 120 using a flip-chip technique. As such, solder bumps (or other appropriate coupling components) 130 are formed on the bottom or mounting surface of the IC chip 110 in a BGA.

In the illustrated embodiment, the substrate 120 on which the IC chip 110 is mounted is a package substrate 120. More specifically, the package substrate 120 includes bonding pads (one of which is labeled 140) formed on an exterior mounting surface that faces the IC chip 110, and which are configured to receive the solder bumps 130 from the IC chip during the flip-chip mounting. Finally, an underfill material 150 may be employed to reinforce the bond between the IC chip 110 and the package substrate 120, as well as insulate the electrical connections provided by the solder bumps 130 in flip-chip applications.

In accordance with the disclosed principles, the package substrate 120 is specifically constructed or selected so that it comprises a coefficient of thermal expansion (CTE) in a direction perpendicular to its mounting surface (arrow Z in FIG. 1A) that is less than approximately twice a CTE along a plane parallel (defined by arrow X and arrow Y in FIG. 1A) to its mounting surface. FIG. 1A illustrates a three-dimensional diagram demonstrating directions that are parallel and perpendicular to the mounting surfaces of the IC chip 110 and package substrate 120 illustrated in FIG. 1, where the parallel plane is defined by the X and Y arrows. In exemplary embodiments implemented by the inventors, the CTE for the package substrate 120 in the perpendicular direction (arrow Z) is less than 35 ppm/° C. In the same exemplary embodiments, the CTE for the package substrate 120 along the parallel plane (arrows X and Y) is less than 15 ppm/° C.

In more specific embodiments, a package substrate 120 was selected that comprises a CTE along the parallel plane of about 11-13 ppm/° C., while its CTE in the perpendicular direction is about 16 ppm/° C. Such exemplary materials for use as the package substrate 120 may be purchased from several different manufacturers. Table 1 sets forth performance characteristics of some exemplary low CTE materials that were tested, as well as the performance characteristics of other materials available for use as package substrates.

As seen from Table 1, Product D has a measured CTE along the parallel plane of about 11-12 ppm/° C., and a CTE in the perpendicular direction of about 27 ppm/° C., along with a glass transition temperature (Tg) of about 165° C. Product E is even better for use as described herein with a measured CTE along the parallel plane of about 13 ppm/° C., and a CTE in the perpendicular direction of about 16 ppm/° C., along with a higher glass transition temperature (Tg) of about 220° C. Similarly, Product F has a measured CTE along the parallel plane of about 14-16 ppm/° C., and a CTE in the perpendicular direction of about 28 ppm/° C., along with a glass transition temperature (Tg) of about 250° C.

TABLE 1

| Product/ Laminate | — | Product A | Product B | Product C | Product D | Product E | Product F |
|---|---|---|---|---|---|---|---|
| Sales point/ | | | High TG | High TG Low CTE | Halogen Free Low CTE | Halogen Free Low CTE | Halogen Free Low CTE | Halogen Free |
| Dielectric Constant Er at 1 GHz | — | | 4.2 | 4.7 | 4.9 | 4.6 | 4.2 | |
| Dielectric Constant Er at 2 GHz | — | | — | 4.7 | 4.9 | — | — | — |
| Dissipation Factor at 1 GHz | — | | 0.018 | 0.014 | 0.014 | 0.0092 | 0.0079- | |
| Dissipation Factor at 2 GHz | — | | — | 0.015 | 0.015 | — | — | — |
| Elemctrical strength | Volts/μm | | — | 60 | 60 | — | — | — |
| Peel Strength | kN/m | | 0.97 | 1.0-1.2 | 1.0-1.2 | 1.0-1.2 | 1.0-1.2 | 1.0-1.2 |
| Moisture Absorption (85 C./85%/1000 hrs) | % | | 0.82 | 0.49 | 0.33 | — | — | — |

TABLE 1-continued

| Product/Laminate | — | Product A | Product B | Product C | Product D | Product E | Product F |
|---|---|---|---|---|---|---|---|
| Water absorption E-24/50 + D24/23 | % | 0.1 | 0.05 | 0.05 | 0.2 | 0.05 | — |
| Tensile strength X/Y | Mpa | 520/459 | 290/— | 290/— | 230/— | —/— | —/— |
| Tensile modulus X/Y | Gpa | 25/23 | 31/— | 25/— | 25/— | —/— | —/— |
| Flexural strength X/Y | Mpa | 500/530 | 450/— | 450/— | 470/— | —/— | —/— |
| Flexural modulus X/Y | Gpa | 24/22 | 30/— | 30/— | 27/— | 27/— | 19/— |
| Youngs modulus X/Y | Gpa | 23/22 | 31/— | 25/— | 22/— | —/— | —/— |
| Poissons ratio X/Y | — | 0.18/0.18 | 0.20/— | 0.20/— | 0.20/— | 0.22-0.27 | — |
| Glass transition temperature Tg | Celsius (DSC/TMA) | 190/180 | —/165 | —/165 | —/176 | —/220 | —/250 |
| CTE X | ppm/Celsius | 14 | 11 | 13 | 11 | 13 | 14 |
| CTE Y | | 16 | 12 | 15 | 12 | 13 | 16 |
| CTE Z | | 50 | 25 | 30 | 27 | 16 | 28 |
| Thermal conductivity | W/m-Celsius | 0.29 | 0.73 | 0.73 | 0.64 | 0.59 | |
| Density | G/cm$^3$ | — | 2.10 | 2.10 | 2.00 | — | — |
| Flame retardant | — | Br | Br | Br, Cl, Sb are free | Br, Cl, Sb are free | Br, Cl, Sb are free | Br, Cl, Sb are free |

Of particular note from Table 1, aside from the large CTE spread of Product A (which is a commonly employed conventional (e.g., organic) package substrate), is the glass transition temperature of some of the low CTE laminate materials shown. For example, although Product B, Product C, and the Product D are all low-CTE candidates, each has a lower glass transition temperature than even the conventional material. Since many processing temperatures, such as a typical solder reflow process, exceed 220° C. (many reflow processes occur at about 260° C.), a decreased glass transition temperature is a disadvantage in several processing steps. In contrast, Product E and Product F laminate materials are not only low-CTE, but also maintain a higher glass transition temperature than conventional organic materials, which makes them more suitable for high-temperature processing steps. Moreover, in addition to beneficial glass transition temperatures and low CTEs, the Product E and Product F materials are also beneficial in that they are halogen-free, which provides for an environmentally friendly material.

As mentioned above, the failure to manage the heat generated by package devices using flip-chip-mounted IC chips may result in device failure, from both an electrical and a structural level. The heat generated from the IC chip during operation may cause the chip dimensions to change, and thus result in damage to signals generated by the chip. Also, thermal expansion brought on by high operational temperatures may cause the chip to curve, bend or crack, and these distortions in the chip may result in damage to the electrical connections between the chip and the substrate. Furthermore, the package substrate onto which the IC chip is mounted may have considerably different (i.e., mismatched) CTEs, which may result in uncontrolled bending or thermal-induced substrate surface distortions. More specifically, the mismatch in CTE between the IC chip (typically around 3 ppm/° C. both along the parallel plane and in the perpendicular direction) and the conventionally employed organic package substrates (typically about 15 ppm/° C. in the parallel plane, but about 50 ppm/° C. in the perpendicular direction) often results in catastrophic package device failure.

Such failures due to CTE mismatch typically result in the IC chip and the package substrate distorting unequally, which can result in the failure of the bond(s) between solder bumps and bonding pads on the IC chip and package substrate. In addition, current manufacturers have continued to lean towards the use of low-k devices, where the exterior (mounting) surfaces of the IC chip comprise at least one low-k layer (e.g., a layer of material having a dielectric constant (k) of about 3.3 or less). Such an optional low-k layer 160 is illustrated on the IC chip 110 in FIG. 1. In such low-k devices, the delamination at the interface of the copper (or comparable metal) layers and/or the low-k layers caused by large CTE mismatches has become a prominent source of device failure.

As a result of the prominence of delamination and other types of device structural failure caused by large CTE mismatches, the disclosed technique replaces the typical organic, plastic, or ceramic package substrate with a low-CTE package substrate. Use of a low CTE material as a package substrate (as compared to, for example, typical printed circuit board implementations) minimizes the CTE mismatch between the package substrate and the CTE of a typical silicon IC chip. By easing the CTE mismatch between these components of the package device, stress at the bonds between the BGA and the bonding pads of the chip or package substrate is relieved by increasing the coplanarity of package substrate and the chip at large temperature variations. Moreover, the disclosed approach is especially beneficial in package devices employing eutectic or lead-free solder bumps/balls, which tend to be more brittle due to less lead content. Still further, the CTE of the selected underfill is less critical due to the decrease in CTE mismatch between the IC chip and the package substrate, which therefore allows the manufacturer of the package device a broader selection of which underfill material is employed.

Table 2 sets forth exemplary measurements for ball coplanarity of package devices (die sizes of 14 mm$^2$×14 mm$^2$) taken using ICOS.

TABLE 2

| Solder Bumps | Package Substrate | Underfill Material | Max CoPlan | Min CoPlan | Average CoPlan | Std Dev |
|---|---|---|---|---|---|---|
| Eutectic | Product E | A | 3.73 | 2.25 | 2.84 | 0.31 |
| Eutectic | Organic (Conventional) | A | 5.34 | 3.96 | 4.75 | 0.35 |

Multiple tests were conducted for package devices with conventional (e.g., organic) package substrates and low CTE substrates as disclosed herein to establish an average solder ball coplanarity, a standard deviation, as shown in Table 2. In addition, testing was conducted with different underfill materials.

Figure 2:
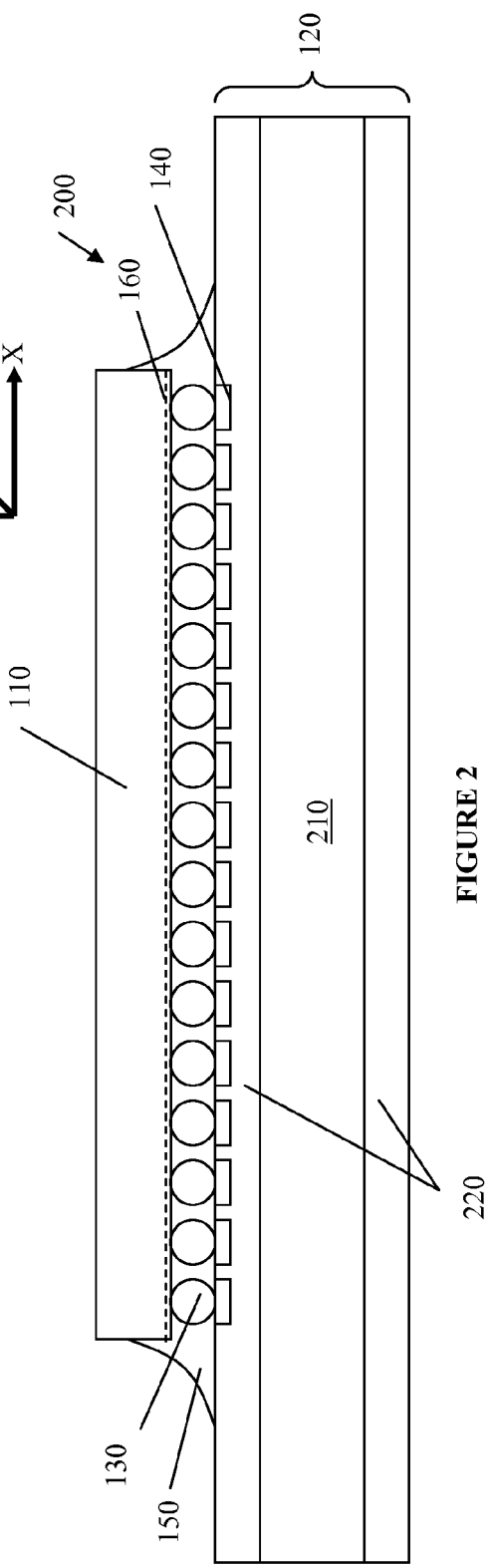
FIG. 2 illustrates another embodiment of the package device illustrated in FIG. 1.

FIG. 2 illustrates another embodiment of the package device 200 illustrated in FIG. 1, but still incorporating the low CTE package substrate disclosed herein. This package device 200 still includes the IC chip 110 mounted via solder bumps 130 on the bonding pads 140 of a package substrate 120. As before, the package substrate 120 is selected to have a CTE in a direction perpendicular to the mounting surface of the package substrate that is less than approximately twice a CTE along a plane parallel to that mounting surface.

In this exemplary embodiment, however, the package substrate 120 is manufactured having multiple layers. More specifically, the package substrate 120 comprises a core layer 210 that is manufactured or selected to provide the low CTE as defined above. For example, the Product E and Product F laminate materials discussed in detail above may be employed as the core layer 210 in the package substrate 120. In such embodiments, the beneficial performance characteristics of materials such as these create a package substrate 120 that provides a low mismatch in CTE between the package substrate 120 and the IC chip 110. These characteristics include, but are not limited to, being halogen-free, having a high glass transition temperature, and having a low CTE. Of course, although Products E and F are described in detail herein, the disclosed techniques are not limited to the implementation of only these particular materials. Rather, any material having the disclosed desirable characteristics, whether intended for semiconductor use or not, may be employed in a package device in the manner set forth herein. Thus, no limitation to any particular single material is intended or should be implied or inferred from this disclosure.

Still referring to FIG. 2, in addition to the core layer 210, the package substrate 120 in this embodiment also now includes build-up layers 220 formed on either side of the core layer 210. Such build-up layers 220 may be added to the core layer 210 for increasing the thickness, density, or strength of the package substrate 120 and/or further assisting with correcting CTE mismatches between the package substrate 120 and the IC chip 110. In advantageous embodiments constructed according to the disclosed principles, build-up layers 220 were also selected or constructed to be low-CTE layers of the package substrate 120. For example, different build-up materials, such as Ajinomoto build-up film (ABF), are available with a large variety of performance characteristics. Likewise, the build-up layers 220 may be solder resist layers selected to help insulate areas surrounding the bonding pads 140 formed on the package substrate 120. Such solder resist layers may also have a variety of performance characteristics that guide the selection or manufacture of a particularly suitable material. Table 3 sets forth performance characteristics for several build-up materials and solder resist materials for use as a part of the package substrate 120.

As shown in Table 3, even build-up films from the same manufacturer (e.g., ABF) can have a large disparity in several performance characteristics that are critical to their use as a portion of a package substrate. Among the halogen-free choices of build-up materials set forth in Table 3 (again, for satisfying environmental concerns), Material C is the closest in CTE (47 ppm/° C. in the direction perpendicular to the mounting surface) to a low-CTE core layer selected or manufactured in accordance with the disclosed principles. Similarly, among the halogen-free choices of solder resist materials set forth in Table 3, Material RB is the closest in CTE (60 ppm/° C. in the direction perpendicular to the mounting surface) to the selected low-CTE core layer.

TABLE 3

| | Build-up material | | | Solder resist material | |
|---|---|---|---|---|---|
| | A | B | C | RA | RB |
| Sales point/ | | Halogen free Low CTE | Halogen free Low CTE | Halogen free Screen coating | Halogen free Dry film |
| CTE z < Tg (Zaxis TMA) | 98 | 60 | 47 | 70 | 60 |
| CTE z .Tg (Zaxis TMA) | 165 | 160 | 155 | 150 | 160 |
| Tg (tensile TMA) | 170 | 153 | 156 | 100 | 104 |
| Tg (DMA) | 200 | 180 | 177 | — | — |
| Young's modulus (GPa) | 3 | 3.5 | 4.0 | 2.7 | 2.7 |
| Tensile strength (MPa) | 70 | 90 | 93 | 50 | 80 |
| Elongation (%) | 6.7 | 7.6 | 5.0 | 3.3 | 6.0 |
| Poisson's ratio | 0.41 | 0.27 | | — | — |
| Dielectric constant (1 MHz/1 GHz) | 3.8/3.4 | 3.8/3.4 | 3.6-3.35 | 4.0/3.8 | 3.9/— |
| Loss tangent (1 MHz/1 GHz) | 0.027/0.022 | 0.017/0.023 | 0.016/0.012 | 0.026/0.026 | 0.027/— |
| Water absorption 100 deg C. 1 h(%) | 1.3 | 1.8 | 1.1 | — | — |
| Flame retardancy(UL94) | V1 | V0 | V0 equiv | V0 | V0 equiv |
| SiO2 amount (wt %) | 12 | 18 | 36 | — | — |

Although the above description sets forth advantages relative to certain prior art implementations, these examples and their performance specifications should not be construed in any way as limitations on the invention or inventions disclosed. The scope of coverage for any patent that issues shall be defined by the claims that any such patent contains. It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A method of manufacturing a semiconductor device, the method comprising:
   providing an integrated circuit chip;
   forming at least one coupling component on an exterior surface of the integrated circuit chip;
   providing a package substrate having a mounting surface, and having a coefficient of thermal expansion in a direction perpendicular to its mounting surface that is less than approximately twice a coefficient of thermal expansion along a plane parallel to its mounting surface; and
   forming bonding pads on the mounting surface that are configured to receive the at least one coupling component.

2. The method according to claim 1, wherein the package substrate comprises a core layer and a build-up layer.

3. The method according to claim 2, wherein the coefficient of thermal expansion for the core layer in the direction perpendicular to the mounting surface is about 16 ppm/° C. and the coefficient of thermal expansion for the core layer along the plane parallel to the mounting surface is about 10-13 ppm/° C.

4. The method according to claim 3, wherein the coefficient of thermal expansion for the build-up layer in the direction perpendicular to the mounting surface is about 47 ppm/° C. and the coefficient of thermal expansion for the build-up layer along the plane parallel to the mounting surface is about 46 ppm/° C.

5. The method according to claim 2, wherein the core layer is halogen-free.

6. The method according to claim 1, wherein the coefficient of thermal expansion for the package substrate in the direction perpendicular to the mounting surface is less than 35 ppm/° C. and the coefficient of thermal expansion for the package substrate along the plane parallel to the mounting surface is less than 15 ppm/° C.

7. The method according to claim 1, wherein the at least one coupling component is a bump for use in a flip-chip bonding technique to couple the integrated circuit chip to the package substrate.

8. The method according to claim 7, wherein the bump comprises a lead, lead alloy, eutectic, or substantially lead-free solder bump.

9. The method according to claim 1, wherein the integrated circuit chip comprises at least one low-k layer with a dielectric constant (k) of about 3.3 or less.

10. A method of manufacturing semiconductor package device, the method comprising:
    providing an integrated circuit chip;
    forming at least one coupling component formed on an exterior surface of the integrated circuit chip;
    providing a package substrate having a mounting surface, and having a coefficient of thermal expansion in a direction perpendicular to its mounting surface is approximately 16 ppm/° C. and a coefficient of thermal expansion along a plane parallel to its mounting surface is approximately 13 ppm/° C.; and
    forming bonding pads on the mounting surface that are configured to receive the at least one coupling component.

11. The method according to claim 10, wherein the package substrate comprises a core layer and a build-up layer, and wherein the coefficient of thermal expansion for the core layer in the direction perpendicular to the mounting surface is the approximately 16 ppm/° C. and the coefficient of thermal expansion for the core layer along the plane parallel to the mounting surface is the approximately 13 ppm/° C.

12. The method according to claim 11, wherein the coefficient of thermal expansion for the build-up layer in the direction perpendicular to the mounting surface is about 47 ppm/° C. and the coefficient of thermal expansion for the build-up layer along the plane parallel to the mounting surface is about 46 ppm/° C.

13. The method according to claim 11, wherein the core layer is halogen-free.

14. The method according to claim 10, wherein the at least one coupling component comprises a lead, lead alloy, eutectic, or substantially lead-free solder bump for use in a flip-chip bonding technique to couple the integrated circuit chip to the package substrate.

15. The method according to claim 10, wherein the integrated circuit chip comprises at least one low-k layer with a dielectric constant (k) of about 3.3 or less.

* * * * *